(12) United States Patent
Yang et al.

(10) Patent No.: US 10,090,838 B2
(45) Date of Patent: Oct. 2, 2018

(54) OVER VOLTAGE TOLERANT CIRCUIT

(71) Applicant: Silicon Laboratories Inc., Austin, TX (US)

(72) Inventors: Chao Yang, Austin, TX (US); Matthew Powell, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/871,734

(22) Filed: Sep. 30, 2015

(65) Prior Publication Data

US 2017/0093388 A1    Mar. 30, 2017

(51) Int. Cl.
  H03K 19/0185   (2006.01)

(52) U.S. Cl.
  CPC ................. H03K 19/0185 (2013.01)

(58) Field of Classification Search
  CPC .................. H03K 19/0185; H03K 19/018507
  See application file for complete search history.

(56) References Cited

U.S. PATENT DOCUMENTS

| | | | | |
|---|---|---|---|---|
| 5,451,889 A * | 9/1995 | Heim | ............... | H03K 19/00315 257/E27.063 |
| 5,534,795 A * | 7/1996 | Wert | ................ | H03K 19/00315 326/58 |
| 5,543,733 A * | 8/1996 | Mattos | ............. | H03K 19/00315 326/68 |
| 5,546,020 A * | 8/1996 | Lee | ....................... | G11C 7/1051 326/83 |
| 5,570,043 A * | 10/1996 | Churchill | ......... | H03K 19/00315 326/21 |
| 5,629,634 A * | 5/1997 | Carl | ................. | H03K 19/00315 326/27 |
| 5,646,550 A * | 7/1997 | Campbell, Jr. | .. | H03K 19/09429 326/121 |
| 5,721,508 A * | 2/1998 | Rees | ................ | H03K 17/08142 326/21 |
| 5,880,602 A * | 3/1999 | Kaminaga | ........ | H03K 19/01852 326/58 |
| 5,926,056 A * | 7/1999 | Morris | ............. | H03K 19/00315 326/81 |
| 5,963,055 A * | 10/1999 | Tanaka | ............. | H03K 19/00315 326/81 |
| 5,973,511 A * | 10/1999 | Hsia | ................ | H03K 19/09429 326/81 |
| 6,150,843 A * | 11/2000 | Shiffer | ............ | H03K 19/00315 326/57 |
| 6,320,415 B1 * | 11/2001 | Lee | .................. | H03K 19/00315 326/57 |

(Continued)

*Primary Examiner* — Jeffrey Zweizig
(74) *Attorney, Agent, or Firm* — Trop, Pruner & Hu, P.C.

(57) ABSTRACT

An apparatus includes an integrated circuit, which includes a processor core, a plurality of input/output (I/O) circuits, and a plurality of over voltage tolerant (OVT) circuits. Each I/O circuit is associated with an I/O pad and is associated with an OVT circuit of the plurality of OVT circuits. At least one of the OVT circuits includes a passive circuit, which is adapted to receive a pad voltage from the associated I/O pad; receive a supply voltage of the associated I/O circuit; and based on a relationship of the received pad voltage relative to the received supply voltage, selectively couple a gate of a transistor of the associated I/O circuit to the pad voltage to inhibit a leakage current.

13 Claims, 11 Drawing Sheets

(56) References Cited

U.S. PATENT DOCUMENTS

| | | | | |
|---|---|---|---|---|
| 6,803,789 B1* | 10/2004 | Yu | ............... | H03K 19/00315 |
| | | | | 326/27 |
| 6,838,915 B2* | 1/2005 | Shin | ............ | H03K 19/00315 |
| | | | | 326/85 |
| 7,180,331 B2* | 2/2007 | Gosmain | ........ | H03K 19/00315 |
| | | | | 326/83 |
| 7,521,965 B2* | 4/2009 | Oertle | ........... | H03K 19/00315 |
| | | | | 326/81 |

* cited by examiner

OVER VOLTAGE TOLERANT CIRCUIT

BACKGROUND

An electrical system (an integrated circuit, a computer system or a microcontroller, as examples) may contain both digital and analog subsystems. The digital subsystem may contain, as examples, a clock generator, bus interfaces (a Universal Serial Bus (USB) interface and a serial peripheral interface (SPI) interface, as examples), a serial communication interface (a universal asynchronous receiver/transmitter (UART) interface, for example), programmable timers, and so forth. The analog subsystem may include such components as an analog-to-digital converter (ADC), current drivers, voltage level translators and so forth.

As a more specific example, an integrated circuit (IC) may contain digital and analog subsystems that are accessed via the pads of the IC. The voltage of a pad of the IC may, for a given application, be higher than the supply voltage of the IC.

SUMMARY

In an example embodiment, a method includes using a transistor of an input/output (I/O) circuit of an integrated circuit to couple an I/O pad of the integrated circuit to the I/O circuit; and inhibiting a leakage current in the transistor due to a voltage of the pad exceeding a supply voltage of the integrated circuit. The transistor includes a control terminal. Inhibiting the leakage current includes coupling a control terminal of a switch to the supply voltage, where the coupling occurs during at least during a first state of the switch in which the switch is deactivated; and activating the switch in response to the voltage of the pad exceeding the supply voltage to transition the switch from the first state to a second state in which the switch couples the control terminal of the transistor to the voltage of the pad.

In another example embodiment, an apparatus includes an input/output (I/O) pad; and an input/output (I/O) circuit to receive a supply voltage. The I/O circuit includes a first p-channel metal oxide field effect transistor (PMOSFET) and a leakage prevention circuit. The leakage prevention circuit includes a gate, a channel and a terminal to communicate current with the channel. The terminal is coupled to the I/O pad, and the first PMOSFET is associated with a substrate and the I/O pad has a pad voltage. The leakage prevention circuit includes a switch that is coupled between the gate of the first PMOSFET and the pad. The switch includes a control terminal that is coupled to the supply voltage, and the switch is adapted to couple the gate of the first PMOSFET to the pad voltage in response to the pad voltage exceeding the supply voltage.

In yet another example embodiment, an apparatus includes an integrated circuit, which includes a processor core, a plurality of input/output (I/O) circuits, and a plurality of over voltage tolerant (OVT) circuits. Each I/O circuit is associated with an I/O pad and is associated with an OVT circuit of the plurality of OVT circuits. At least one of the OVT circuits includes a passive circuit, which is adapted to receive a pad voltage from the associated I/O pad; receive a supply voltage of the associated I/O circuit; and based on a relationship of the received pad voltage relative to the received supply voltage, selectively couple a gate of a transistor of the associated I/O circuit to the pad voltage to inhibit a leakage current.

Advantages and other features will become apparent from the following drawings, description, and claims.

DETAILED DESCRIPTION

Figure 1:
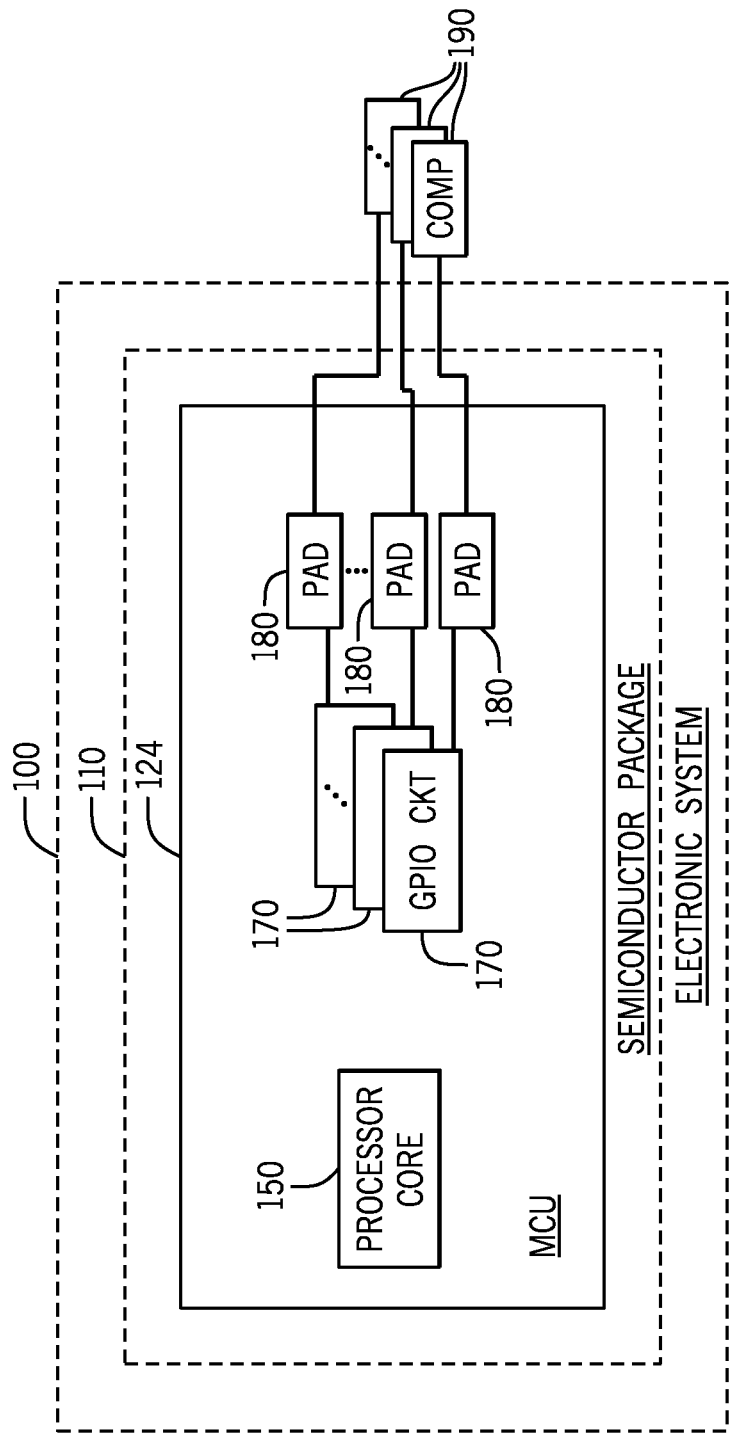
FIG. 1 is a schematic diagram of a microcontroller unit (MCU)-based system according an example embodiment.

Referring to FIG. 1, in accordance with example embodiments, an electronic system 100 includes general purpose input/output (GPIO) circuits 170, which allow access to various analog and digital subsystems of the electronic system 100. For the specific example of FIG. 1, the GPIO circuits 170 are coupled to associated pads 180 of a microcontroller unit (MCU) 124; and the MCU 124, as depicted in FIG. 1, may be part of a semiconductor package 110, or integrated circuit (IC). As an example, the pads 180 may be metal regions of the IC, which are externally accessible by various external components 190 for purposes of forming electrical connections (connections via bond wires, solder bumps, and the like) with the IC.

For embodiments in which the electronic system 100 contains an MCU 124 with such GPIO circuits 170, the MCU 124 may further contain one or multiple processor cores 150. As an example, the processor core 150 may be a 32-bit core, such as the Advanced RISC Machine (ARM) processor core, which executes a Reduced Instruction Set Computer (RISC) instruction set.

The GPIO circuit 170, in accordance with example embodiments, may provide digital input, digital output, analog channel and on-chip pullup/pulldown circuits. For many applications, the voltage of the pad 180 (called the "PAD voltage" herein) may be higher than the supply voltage (called the "VDDIO voltage" herein). In accordance with example embodiments, the GPIO circuit 170 includes circuitry to avoid unintentional damage of GPIO circuitry as well as inhibit, if not prevent, transistor leakage current, as further described herein.

Figure 2:
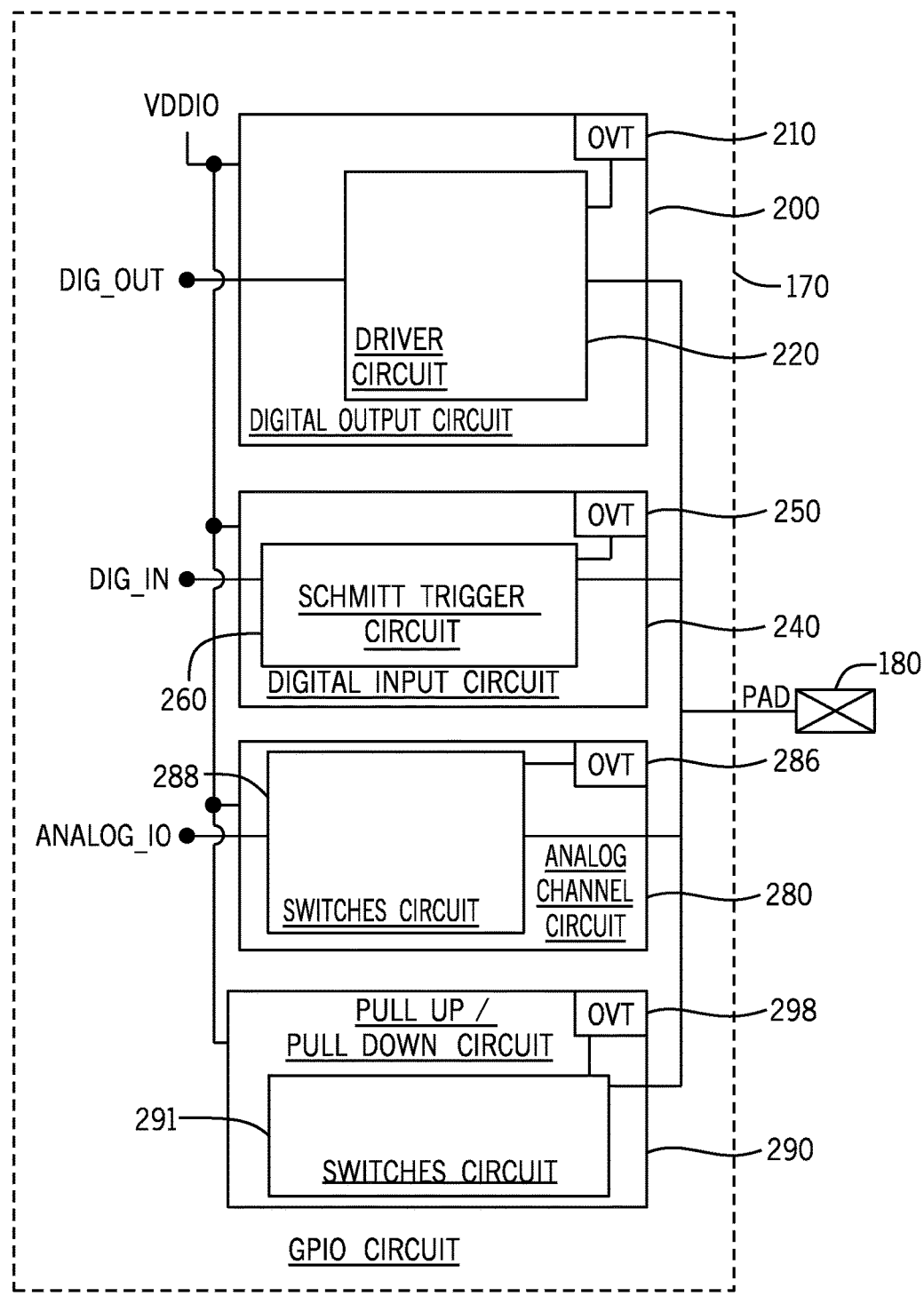
FIG. 2 is a schematic diagram of a general purpose input/output (GPIO) circuit of the MCU of FIG. 1, according to an example embodiment.

More specifically, referring to FIG. 2 in conjunction with FIG. 1, in accordance with example embodiments, a given GPIO circuit 170 may contain digital and analog circuits that are coupled to a given pad 180: a digital output circuit 200, for purposes of driving the pad 180 with a digital output signal; a digital input circuit 240, for purposes of receiving a digital input signal (called "DIG_IN" herein) from the pad 180 (called "DIG_OUT" herein); an analog channel circuit 280, for purposes of communicating an analog signal (called "ANALOG_IO" herein) with the pad 180; and a pullup/pulldown circuit 290, for purposes of pulling up or pulling down the pad 180 through an associated pullup/pulldown resistor.

The circuits 200, 240, 280, and 290 include associated over voltage tolerant (OVT) circuits 210, 250, 286, and 298, respectively, for purposes of sensing when the PAD voltage (i.e., the voltage of the pad 180) exceeds the VDDIO voltage (i.e., the supply voltage for the circuit 200, 240, 280, or 290), and triggering associated protection circuits to avoid any unintentional pad leakage or circuit device damage. In accordance with example embodiments described herein, the OVT circuit protection is distributed among the circuits 200, 240, 280, and 290 such that the OVT protection is handled autonomously inside each circuit 200, 240, 280, and 290, without consuming static current. As a result, the pad leakage current may be relatively low (less than one nano ampere (nA), for example) with any valid PAD voltage, in accordance with example embodiments.

Figure 3:
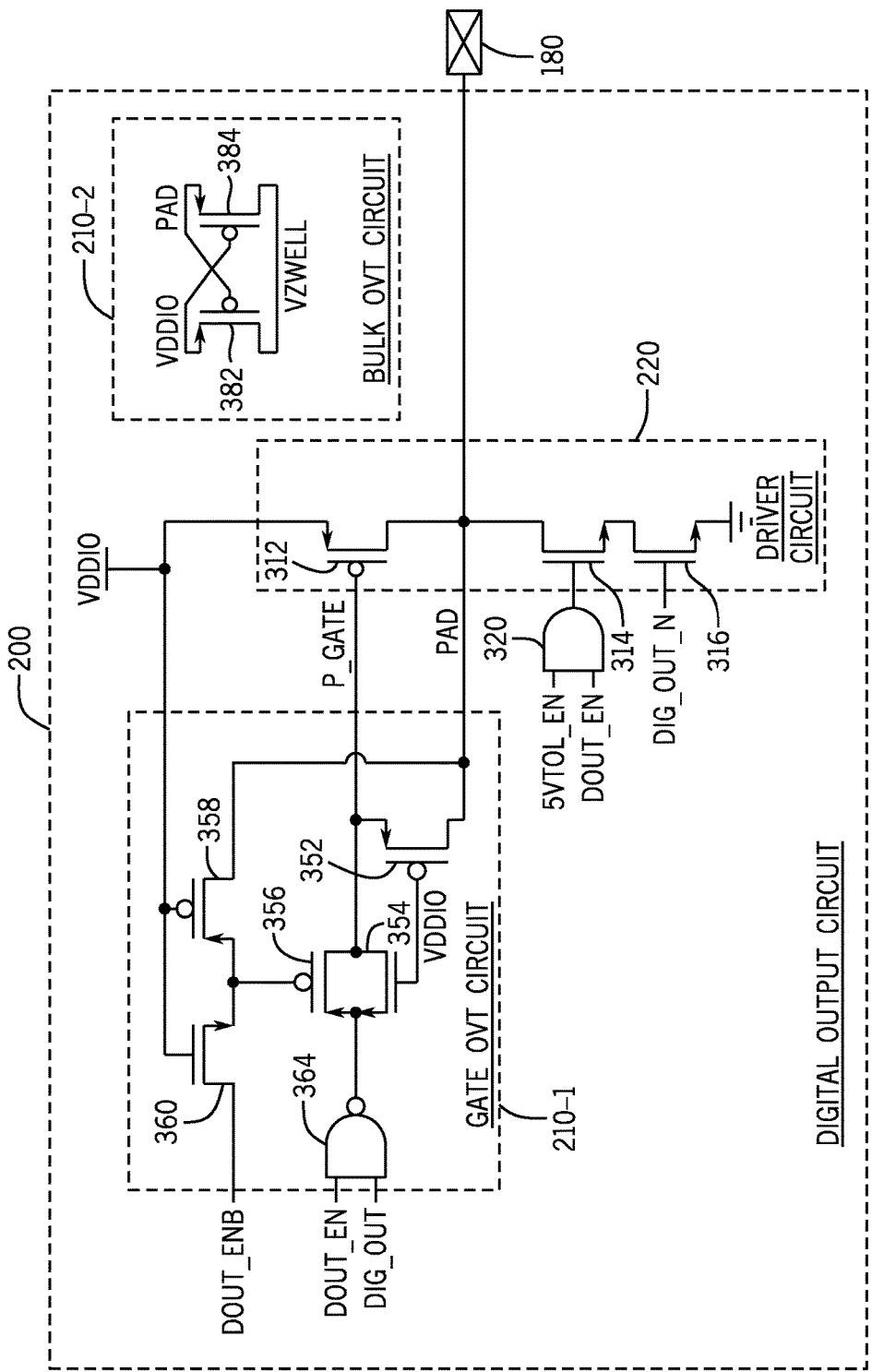
FIG. 3 is a schematic diagram of a digital output circuit of the GPIO circuit of FIG. 2, according to an example embodiment.

As a more specific example, FIG. 3 depicts the digital output circuit 200, in accordance with example embodiments. As described herein, the OVT circuit 210 for the digital output circuit 200 includes two OVT circuits: a gate OVT 210-1; and a bulk OVT 210-2, which are passive circuits that respond to the PAD voltage exceeding the VDDIO voltage for purposes of inhibiting leakage current and protecting circuit components.

In accordance with example embodiments, the digital output circuit 200 includes a driver circuit 220, which, when enabled, drives the pad 180 with a digital output. In general, the driver circuit 220 is enabled in response to the assertion of a DOUT_EN signal (the driving of the DOUT_EN signal to a logic one, for example) and the de-assertion of a DOUT_ENB signal (the driving of the DOUT_ENB signal to a logic zero). The digital signal to be driven to the pad 180, in turn, is indicated by the DIG_OUT signal (driven to a logic one to indicate a logic one to be driven onto the pad 180, for example) and a DIG_OUT_N signal (driven to a logic zero to indicate a logic zero to be driven onto the pad 180, for example). Moreover, for this particular embodiment, for the driver circuit 220 to be enabled, a 5VTOL_EN signal is asserted (driven to a logic one, for example).

The following discussion assumes that the driver circuit 220 is enabled. To drive the pad 180 to a logic one, the gate voltage (called "P_GATE" herein) of a p-channel metal oxide semiconductor field effect transistor (PMOSFET) 312 of the driver circuit 220 is driven low to cause the source-to-drain current path of the PMOSFET 312 to conduct and pull the pad 180 to the VDDIO voltage. For purposes of driving the pad 180 to a logic zero voltage, the gate of an n-channel metal oxide semiconductor field effect transistor (NMOFET) 316 (which receives the DIG_OUT_N signal) is asserted, which causes the drain-to-source current path of the NMOSFET 316 to conduct to pull the PAD voltage low.

As depicted in FIG. 3, the driver circuit 220 contains an additional NMOSFET 314 for purposes of selectively enabling and disabling the circuit 220. For the example embodiment of FIG. 3, the drain-to-source current path of the NMOSFET 314 is coupled between the pad 180 and the drain of the NMOSFET 316. Moreover, as shown in FIG. 3, the source-to-drain current path of the PMOSFET 312 is coupled between the VDDIO voltage and the pad 180; and the drain-to-source current path of the NMOSFET 316 is coupled between the source of the NMOSFET 314 and ground. The gate of the NMOSFET 314 is coupled to the output of an AND gate 320. Inputs of the AND gate 320 receive the DOUT_EN signal and the 5VTOL_EN signal.

The PMOSFET 312 of the driver circuit 220 may experience a leakage current when its gate voltage, the P_GATE gate, is lower than the drain voltage of the PMOSFET 312. For purposes of inhibiting, if not preventing any such leakage current, the gate OVT circuit 210-1 regulates the PMOSFET gate voltages, and the OVT circuit 210-2 regulates the bulk, or substrate voltage. In general, the OVT circuit 210-1 regulates the P_GATE voltage to prevent leakage current when the driver circuit 220 is disabled. In this manner, when the driver circuit 220 is enabled, the gate OVT circuit 210-1 allows the DIG_OUT signal to control the P_GATE voltage for purposes of controlling the assertion and de-assertion of the pad 180. When the driver circuit 220 is disabled, the gate OVT circuit 210-1 regulates the P_GATE voltage so that the P_GATE voltage is equal to the maximum of the VDDIO voltage and the PAD voltage. The bulk OVT circuit 210-2 regulates the bulk voltage for the PMOSFET 312 so that the bulk voltage (called the "VZWELL voltage" herein) is equal to the maximum of the VDDIO voltage and the PAD voltage.

Turning to the more specific details, in accordance with example embodiments, when the driver circuit 220 is enabled, the gate OVT circuit 210-1 ensures that the DIG_OUT signal eventually drives the gate of the PMOSFET 312. In this manner, the DOUT_EN signal and the DIG_OUT signal are received as inputs to a NAND gate 364 whose inverted output terminal is coupled to the sources of a PMOSFET 356 and an NMOSFET 354. The drains of the PMOSFET 356 and the NMOSFET 354, in turn, are coupled to the gate of the PMOSFET 312. When the DIG_OUT signal is asserted (driven to a logic one, for example), the output terminal of the NAND gate 364 is de-asserted (driven to a logic zero, for example). As a result, the drain-to-source current path of the NMOSFET 354 conducts to couple the P_GATE voltage to the ground to cause the source-to-drain of the current path of the PMOSFET 312 to conduct. As depicted in FIG. 3, the gate of the NMOSFET 354 receives the VDDIO voltage. In response to the de-assertion of the DIG_OUT signal (the driving of the DIG_OUT signal to logic zero, for example) the output of the NAND gate 364 is asserted (driven to a logic one, for example) to cause the source-to-current path of the PMOSFET 356 to conduct to turn off the PMOSFET 312.

When the driver circuit 220 is disabled, the gate OVT circuit 210-1 regulates the gate and bulk voltages of the PMOSFETs 312 and 356 to cause these voltages to be the maximum of the PAD voltage and VDDIO voltage. More specifically, in accordance with example embodiments, in response to the PAD voltage exceeding the VDDIO voltage, the source-to-drain current path of a PMOSFET 352 conducts to couple the gate of the PMOSFET 312 to the PAD voltage. As depicted in FIG. 3, the source of the PMOSFET 352 is coupled to the gate of the PMOSFET 312, the gate of the PMOSFET 352 is coupled to the VDDIO voltage and the drain of the PMOSFET 352 is coupled to the pad 180.

For purposes of coupling the gate of the PMOSFET 356 to the pad 180 when the PAD voltage is greater than the VDDIO voltage, the gate OVT circuit 210-1 includes an NMOSFET 360 and a PMOSFET 358. As depicted in FIG. 3, the drain of the NMOSFET 360 receives the DOUT_ENB signal, the source of the NMOSFET 360 is coupled to the gate of the PMOSFET 356, and the gate of the NMOSFET 360 receives the VDDIO voltage. The source of the PMOSFET 358 is coupled to the gate of the PMOSFET 356 and the source of the NMOSFET 360; the gate of the PMOSFET 358 receives the VDDIO voltage; and the drain of the PMOSFET 358 is coupled to the pad 180. When the driver circuit 220 is disabled and the PAD voltage exceeds the VDDIO voltage, the source-to-drain current path of the PMOSFET 358 conducts to couple the gate of the PMOSFET 356 to the pad 180.

The bulk OVT circuit 210-2 includes a passive comparator, which couples the maximum of the VDDIO voltage and PAD voltage to the substrate in which the PMOSFETs are fabricated. As shown, in accordance with some embodiments, the passive comparator may be formed from cross-coupled PMOSFETs 382 and 384, which select the maximum of the VDDIO voltage and the PAD voltage and couple the selected voltage to the VZWELL substrate voltage. In this regard, the source of the PMOSFET 382 is coupled to the gate of the PMOSFET 384; the source of the PMOSFET is coupled to the gate of the PMOSFET 382; and the drains of the PMOSFETs 382 and 384 are coupled together and to the VZWELL voltage.

Thus, when the driver circuit 220 is disabled and the PAD voltage exceeds the VDDIO voltage, both the bulk and gate of each of the PMOSFETs 312 and 356 are coupled to the PAD voltage to prevent leakage current.

Figure 4A:
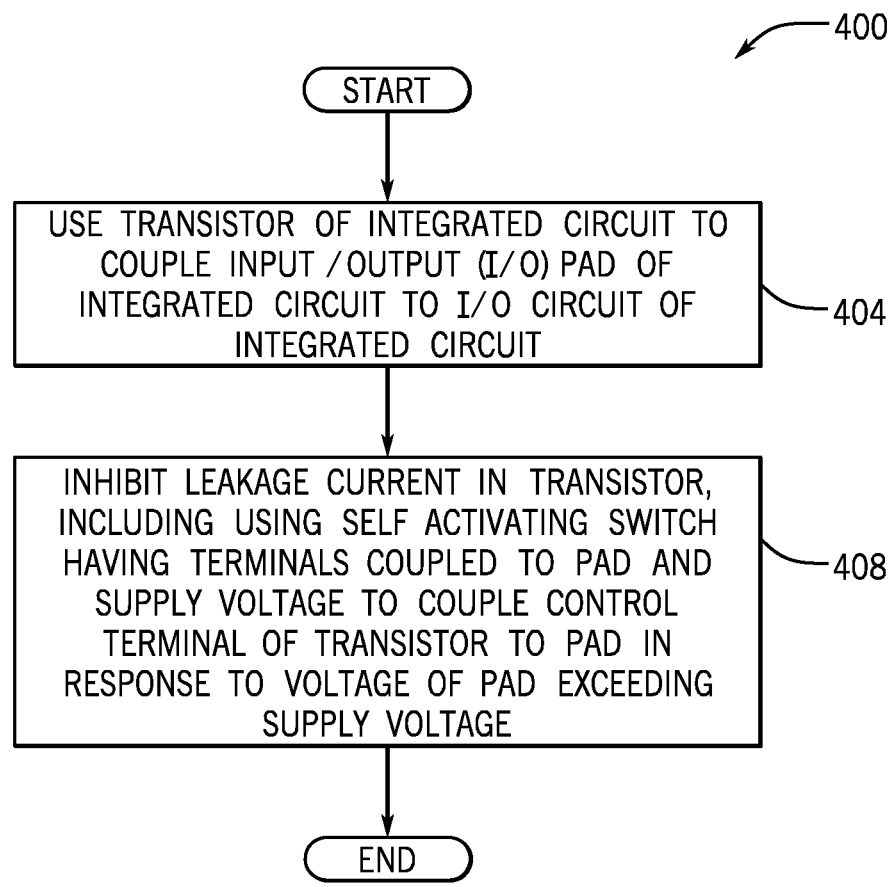
FIGS. 4A and 4B are flow diagrams depicting techniques to inhibit transistor leakage current according to example embodiments.

Thus, referring to FIG. 4A in accordance with example embodiments, a technique 400 includes using (block 404) a transistor of an integrated circuit to couple an input/output (I/O) pad of the integrated circuit to an I/O circuit of the integrated circuit. Pursuant to the technique 400, leakage current is inhibited in the transistor, where this inhibiting includes using a self-activating switch having terminals coupled to the pad into the supply voltage to couple the control terminal of the transistor to the pad in response to the voltage of the pad exceeding the supply voltage, pursuant to block 408.

Figure 4B:
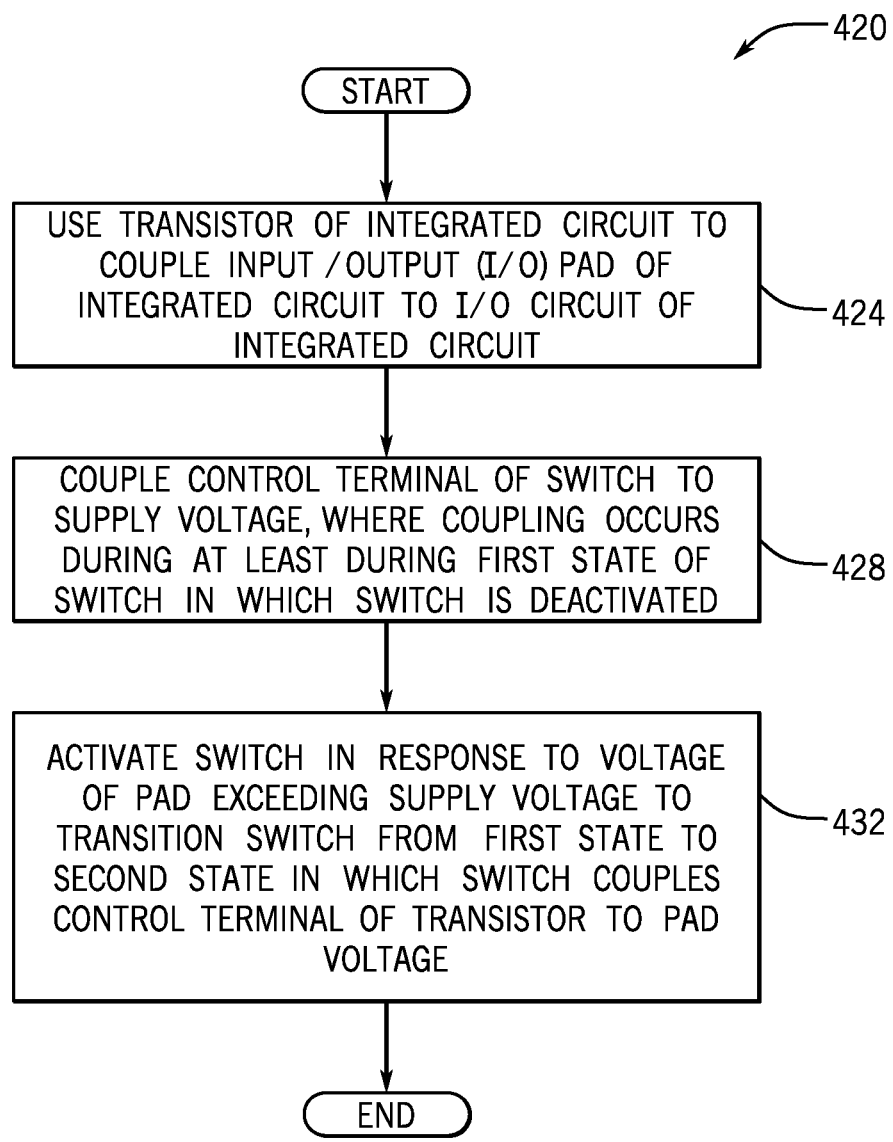

More specifically, in accordance with example embodiments, a technique 420 that is depicted in FIG. 4B includes using (block 424) a transistor of an integrated circuit to couple an I/O pad of the integrated circuit to an I/O circuit of the integrated circuit and coupling (block 428) a control terminal of the switch to a supply voltage, where the coupling occurs during at least a first state of the switch in which the switch is deactivated. Pursuant to the technique 420, the switch may be activated (block 432) in response to a voltage of the pad exceeding the supply voltage to transition the switch from a first state to a second state in which the switch couples the control terminal of a transistor to the pad voltage.

Figure 5:
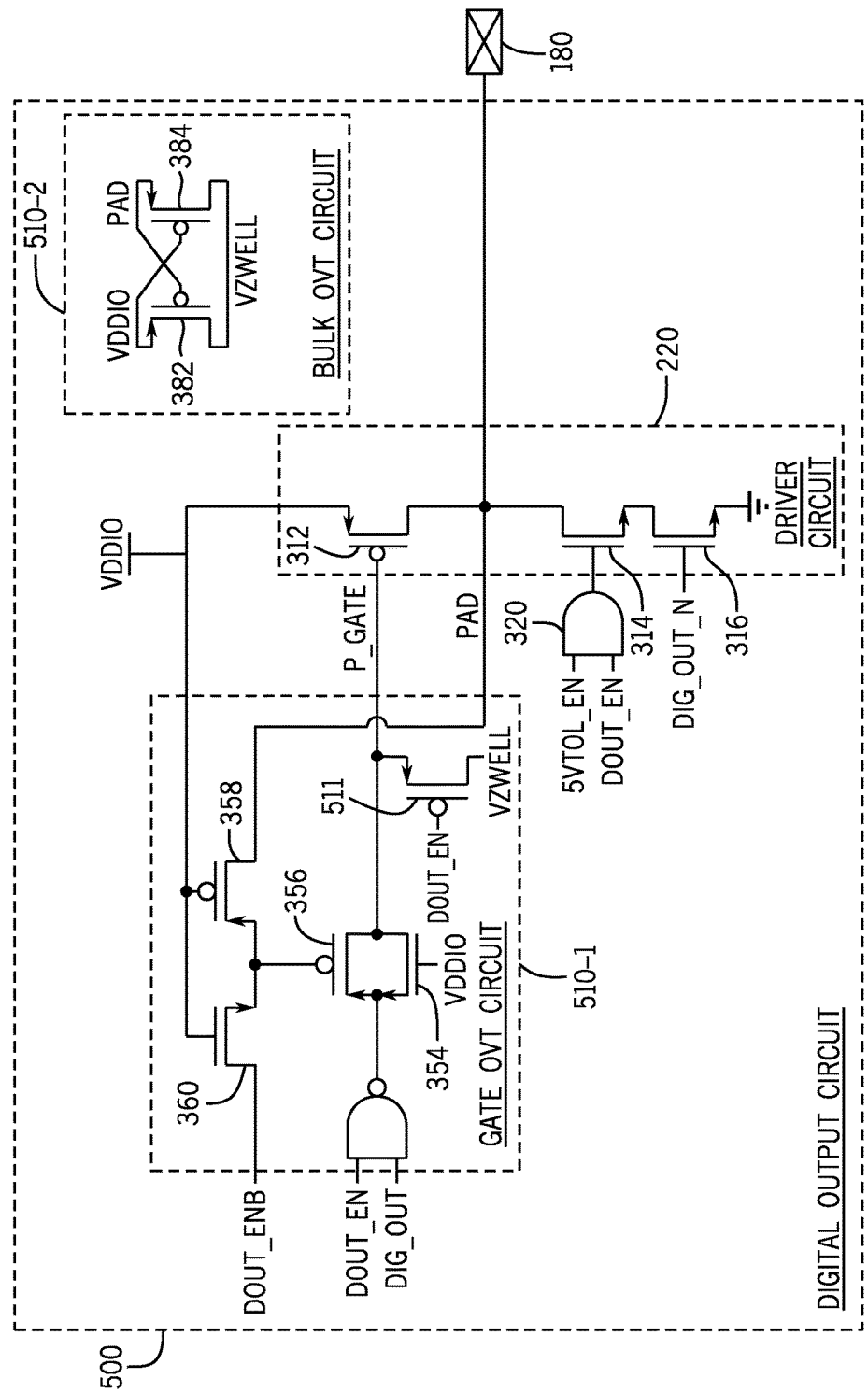
FIG. 5 is a schematic diagram of a digital output circuit according to a further example embodiment.

In accordance with a further example embodiment, the digital output circuit 200 of FIG. 3 may be replaced by a digital output circuit 500 that is depicted in FIG. 5. Referring to FIG. 5 in conjunction with FIG. 2, the digital output circuit 500 has a similar design to the digital output circuit 200, with like reference numerals being used to denote similar components. Different reference numerals are used in FIG. 5 to denote different components. In particular, the digital output circuit 500 includes a gate OVT circuit 510-1, which replaces the gate OVT circuit 210-1 of the digital output circuit 200. In particular, the gate OVT circuit 510-1 includes a PMOSFET 511, which replaces the PMOSFET 352 of the gate OVT circuit 210-1 for purposes of coupling the gate of the PMOSFET 312 to the pad 180 when the driver circuit 220 is disabled and the PAD voltage exceeds the VDDIO voltage. The source of the PMOSFET 511 is coupled to the gate of the PMOSFET 312; the gate of the PMOSFET 511 receives the DOUT_EN signal; and the drain of the PMOSFET 511 is coupled to the VZWELL voltage.

Figure 6A:
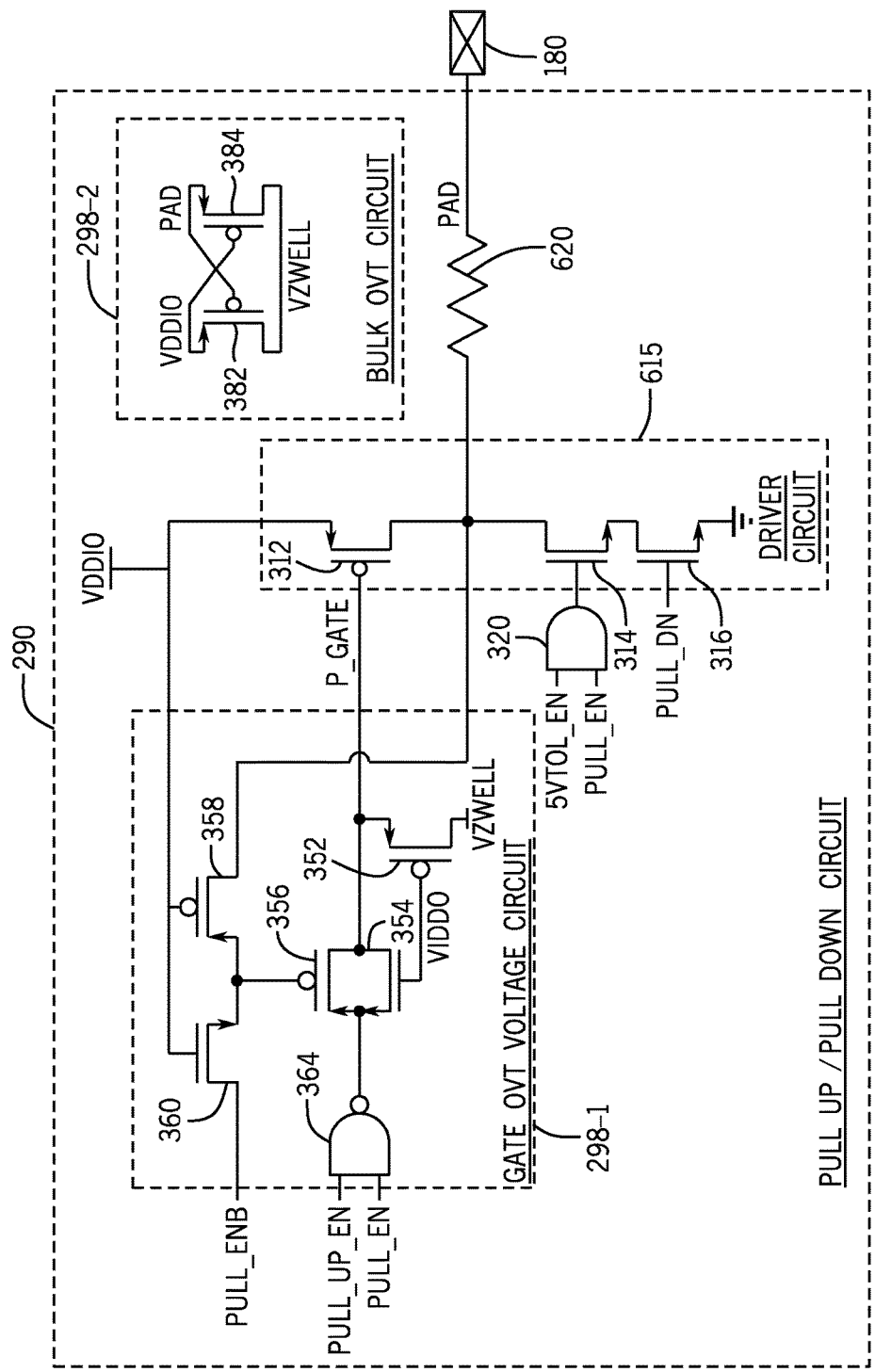
FIG. 6A is a schematic diagram of a pull up/pull down circuit of the GPIO circuit of FIG. 2 according to an example embodiment.

Referring to FIG. 6A, in accordance with example embodiments, the pullup/pulldown circuit 290 contains a driver circuit 615, which has a similar design to the driver circuit 220 (see FIG. 3), with similar reference numerals being used to denote similar components. Unlike the driver circuit 220, the gate of the NMOSFET 316 receives a signal (called the "PULL_DN" in FIG. 6A), which is asserted to pull the pad 180 (via a resister 620) to a logic zero. Moreover, for purposes of enabling the driver circuit 615, the AND gate 320 receives the 5VTOL_EN signal and the PULL_EN signal.

The OVT circuit 298 for the pullup/pulldown circuit 290 contains two component circuits: a gate OVT circuit 298-1 and a bulk OVT circuit 298-2. The bulk OVT circuit 298-2 has a similar design to the bulk OVT circuit 510-2 (see FIG. 5) with like reference numerals being used to denote similar components. Likewise, aspects of the gate OVT voltage circuit 298-1 are similar to components of the gate OVT circuit 510-1 (see FIG. 5), with like reference numerals being used to denote similar components. However, the drain of the NMOSFET 360 receives a signal (called the "PULL_ENB"), which is asserted when the driver circuit 615 is disabled and de-asserted when the driver circuit 615 is enabled. The NAND gate 364, instead of receiving the DOUT_EN signal and the S6 signal, receives a PULL_UP_EN signal (asserted to enable the driver circuit 615) and the PULL_EN signal.

Figure 6B:
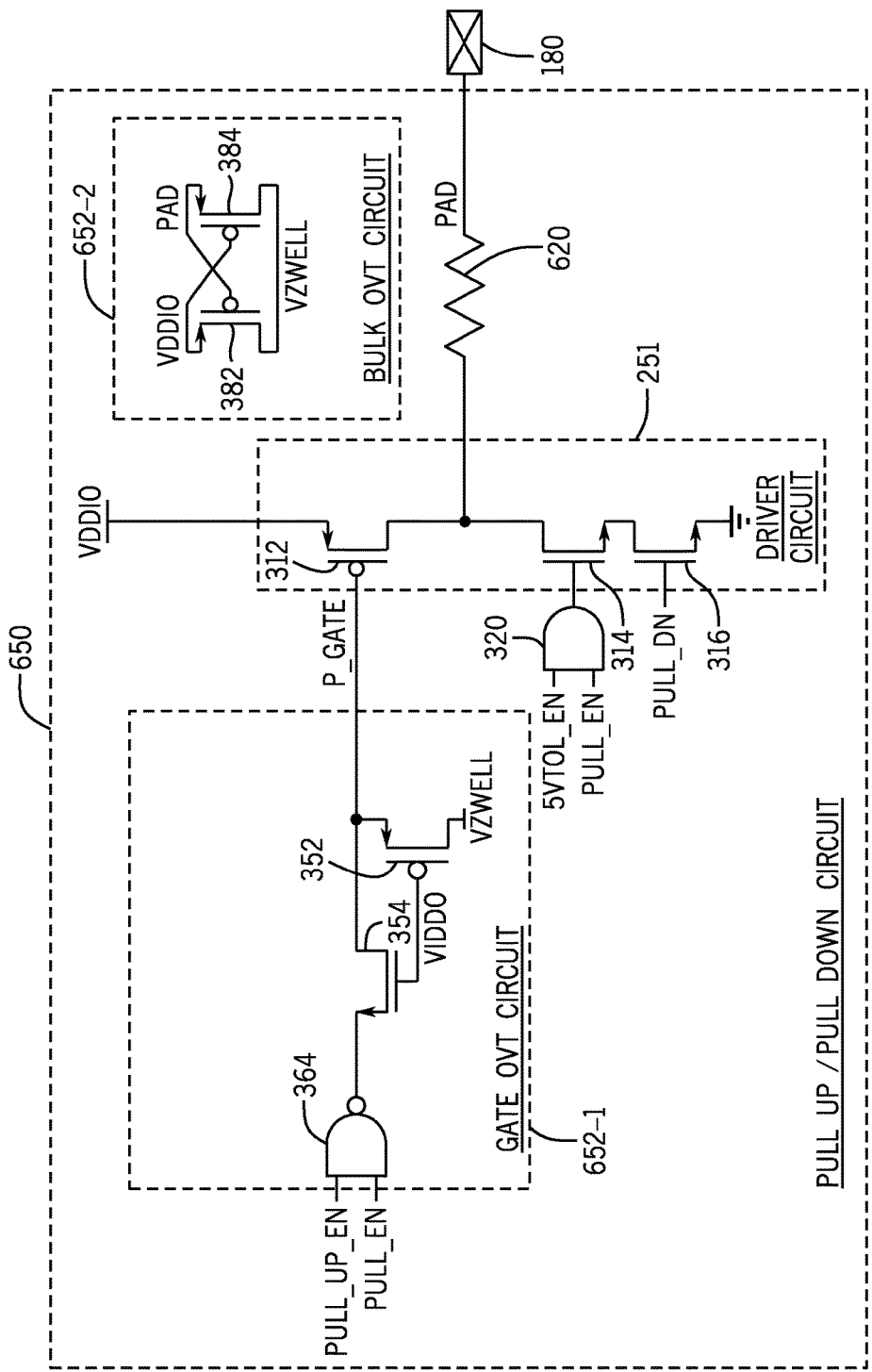
FIG. 6B is a schematic diagram of a pull up/pull down circuit according to a further example embodiment.

FIG. 6B depicts a pullup/pulldown circuit 650, in accordance with further example embodiments. In general, the pullup/pulldown circuit 650 has a similar design to the pullup/pulldown circuit 290, with like reference numerals being used to denote similar components, however, unlike the pullup/pulldown circuit 290, the pullup/pulldown circuit 650 in FIG. 6B has a gate OVT circuit 652-1 (replacing the gate OVT circuit 298-1), without the NMOSFET 360 and PMOSFET 358. Such a design creates a simplified OVT circuit, where speed is not a concern.

Figure 7A:
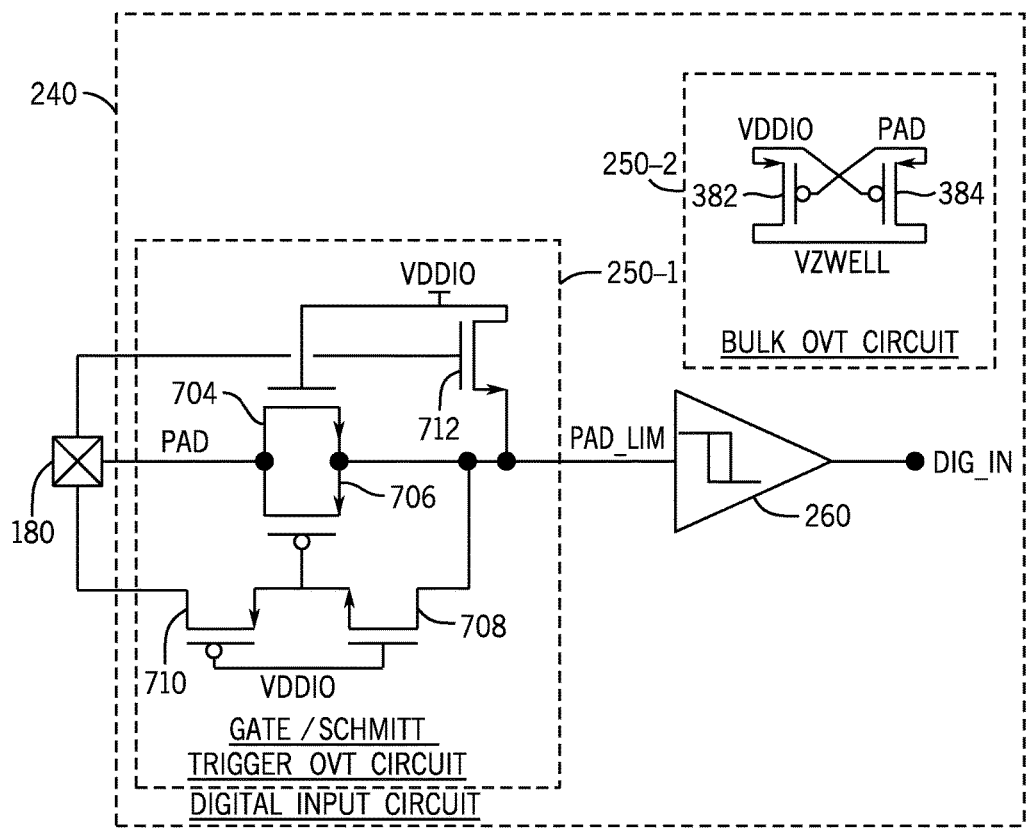
FIG. 7A is a schematic diagram of a digital input circuit of the GPIO circuit of FIG. 2 according to an example embodiment.

Referring to FIG. 7A, in accordance with example embodiments, the digital input circuit 240 contains a Schmitt trigger circuit 260, which, in general, when the digital input circuit 240 is enabled, applies the hysteresis of the Schmitt trigger circuit 260 to the PAD voltage for purposes of generating a DIG_IN signal at the output of the circuit 260 representing the received digital voltage. As depicted in FIG. 7A, the gate/Schmitt trigger OVT circuit 250-1 of the digital input circuit 240 is coupled between the pad 180 and the input terminal of the Schmitt trigger circuit 260 for purposes of providing a voltage (called the "PAD_LIM voltage" in FIG. 7A) to the Schmitt trigger circuit 260. In accordance with example embodiments, the gate/Schmitt trigger OVT circuit 250-1 includes a transmission gate that is formed from an NMOSFET 704 and a PMOSFET 706. The drain of the NMOSFET 704 is coupled to the pad 180; the gate of the NMOSFET 704 receives the VDDIO voltage; and the source of the NMOSFET 704 is coupled to the input terminal of the Schmitt trigger circuit 260. The drain of the PMOSFET 706 is coupled to the pad 180; and the source of the PMOSFET 706 is coupled to the input terminal of the Schmitt trigger circuit 260.

In general, the gate/Schmitt trigger OVT circuit 250-1 communicates the PAD voltage to the input terminal of the Schmitt trigger circuit 260 and limits it to the VDDIO voltage to avoid device damage inside the Schmitt trigger circuit 260. In this regard, an NMOSFET 712 of the gate/Schmitt trigger OVT circuit 250-1 performs this general clamping of the PAD_LIM voltage. The gate of the NMOSFET 712 is coupled to the pad 180; the drain of the NMOSFET 712 is coupled to the VDDIO voltage; and the source of the NMOSFET 712 is coupled to the input terminal of the Schmitt trigger circuit 260.

Figure 7B:
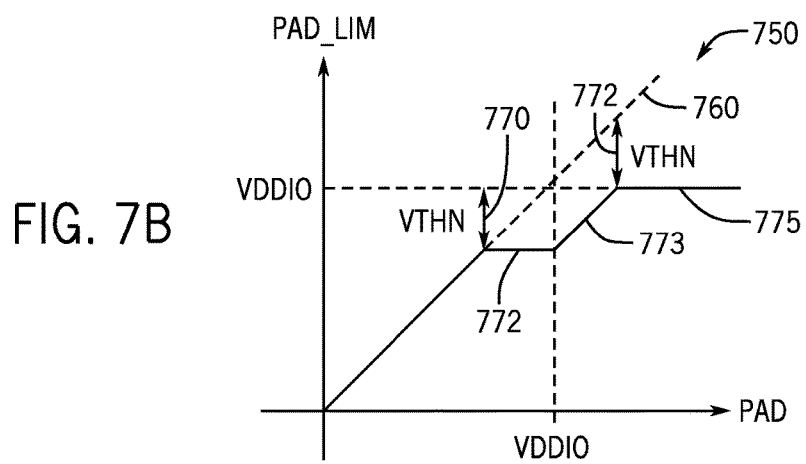
FIG. 7B is voltage transfer waveform illustrating a relationship between an input voltage of a Schmitt trigger circuit versus a pad voltage according to an example embodiment.

Referring to FIG. 7B in conjunction with FIG. 7A, the NMOSFET 704 couples the pad 180 to the PAD_LIM voltage. In general, the PAD_LIM voltage has a linear relationship to the PAD voltage, as indicated by line 760 of FIG. 7B; and the PAD_LIM voltage is clamped, or limited, to the VDDIO voltage, as indicated by line 775 of FIG. 7B. However, as also depicted in FIG. 7B, due to a gate-to-source threshold voltage 770 (called the "VTHN voltage" in FIG. 7B) of the NMOSFET 704, the PAD_LIM voltage is limited to a lower voltage, as indicated by line 772 of FIG. 7B. The gate/Schmitt trigger OVT circuit 250-1, however, contains additional circuitry to raise the upper limit of the PAD_LIM voltage to ensure that the PAD_LIM voltage is limited to the VDDIO voltage. This, in turn, prevents a static crowbar current inside the Schmitt trigger circuit 260 when the PAD voltage is equal to the VDDIO voltage.

More specifically, in accordance with example embodiments, the PMOSFET 706, a PMOSFET 710 and an NMOSFET 708 of the gate/Schmitt trigger OVT circuit 250-1 prevent this leakage current. In particular, this circuitry ensures that the PAD voltage is high enough to turn off a PMOSFET (not shown in FIG. 7A) inside the Schmitt trigger circuit 260 for purposes of ensuring that this PMOSFET is turned off. More specifically, the drain of the PMOSFET 710 is coupled to the pad 180, the source of the PMOSFET 710 is coupled to the gate of the PMOSFET 706 and source of the NMOSFET 708; and the gate of the PMOSFET 710 receives the VDDIO voltage. The drain of the NMOSFET 708 is coupled to the input of the Schmitt trigger circuit 260; and the gate of the NMOSFET 708 receives the VDDIO voltage. Due to this when the PAD_LIM voltage is at or near the VDDIO voltage, the drain-to-source current path of the NMOSFET 708 conducts to turn off current conduction by the PMOSFET 706 and allow the NMOSFET 712 to pull the PAD_LIM voltage to the VDDIO voltage, as indicated in the transition represented by line 773 of FIG. 7B.

Figure 8A:
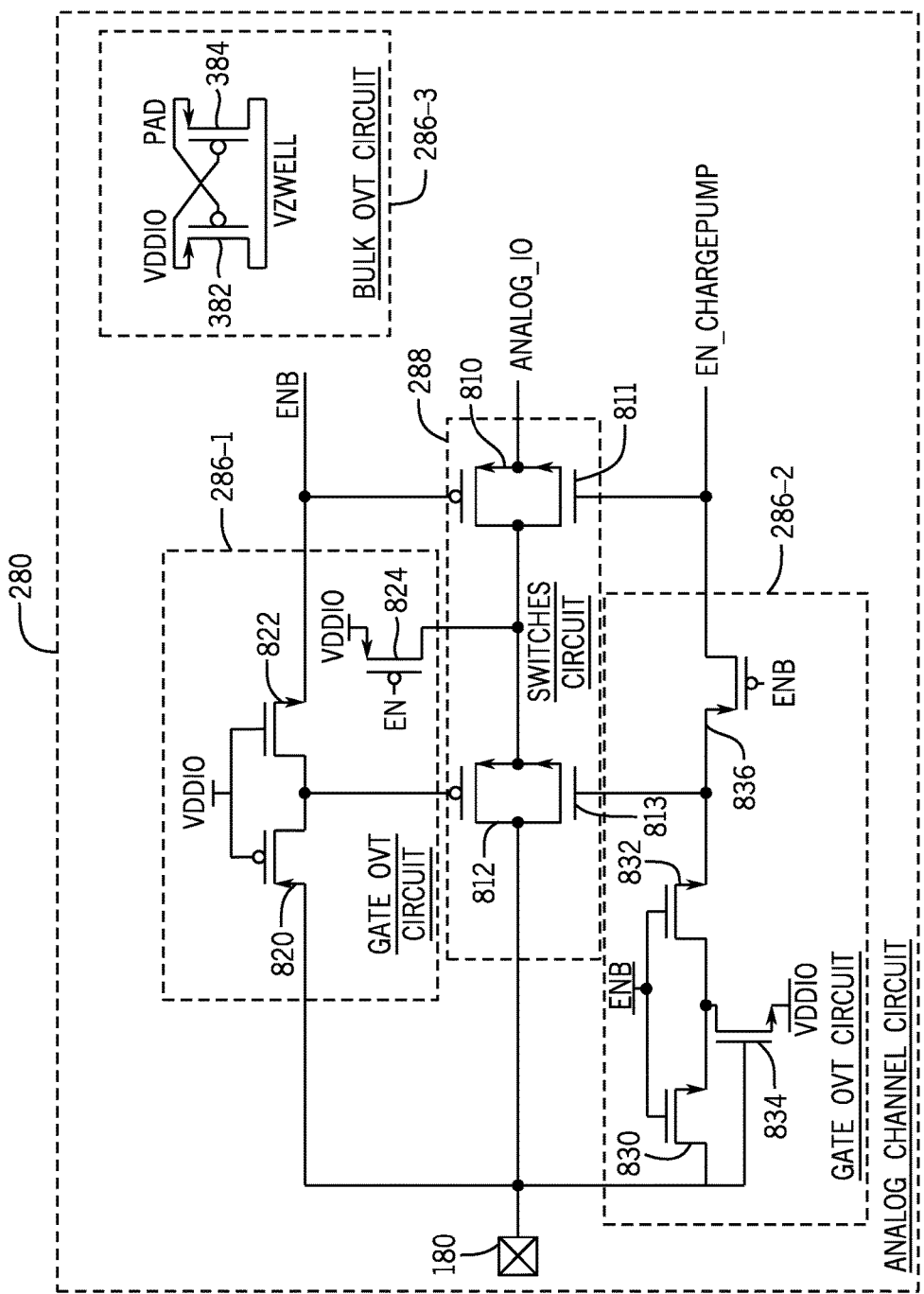
FIG. 8A is a schematic diagram of an analog channel circuit of the GPIO circuit of FIG. 2 according to an example embodiment.

Referring to FIG. 8A, in accordance with example embodiments, the analog channel circuit 280 contains an OVT circuit that is formed from three circuit components: a gate OVT circuit 286-1; a gate OVT circuit 286-2; and a bulk OVT circuit 286-3. In general, the bulk OVT circuit 286-3 has a similar design to the bulk OVT circuit 210-2 (see FIG. 3), with like reference numerals being used to denote similar components. The analog channel circuit 280 includes a switch circuit 288, which is enabled to couple the pad 180 to an internal terminal 801 to form a corresponding signal (called the "ANALOG_IO signal" in FIG. 8A). As depicted in FIG. 8A, in accordance with example embodiments, the switch circuit 288 contains a first transmission gate that is formed from a PMOSFET 812 and an NMOSFET 813; and another pass gate that is formed from a PMOSFET 810 and an NMOSFET 811.

The gate OVT circuit 286-1 regulates the gate voltage of the PMOSFET 812. In this manner, the gate of the PMOSFET 812 is coupled to the drains of a PMOSFET 820 and an NMOSFET 822. The gates of the PMOSFET 820 and NMOSFET 822 receive the VDDIO voltage; the source of the NMOSFET 822 receives a signal (called the "ENB signal" in FIG. 8A) for purposes of enabling the switch circuit 288 when de-asserted; and the source of the PMOSFET 820 is coupled to the pad 180.

Due to this arrangement, when the switch circuit 288 is disabled and when the PAD voltage is greater than the VDDIO voltage, the gate OVT circuit 286-1 sets the gate of the PMOSFET 812 to the PAD voltage to avoid any leakage, in conjunction with the bulk OVT circuit 286-3 setting the bulk voltage, i.e., the VZWELL voltage, to the PAD voltage. As also depicted in FIG. 8A, the gate OVT circuit 286-1, In accordance with example embodiments, includes an NMOSFET 824 that couples the node between the pass gates to the VDDIO voltage when the switch circuit 288 is disabled.

The gate OVT circuit 286-2, in accordance with example embodiments, sets the gate voltage of the NMOSFET 813 to the minimum of the PAD voltage and the VDDIO voltage to avoid over voltage stress on the gate-to-source of the NMOSFET 813. As depicted in FIG. 8A, the gate OVT circuit 286-2 includes an NMOSFET 830 that has its drain coupled to the pad 180. The gate of the NMOSFET 830 receives the ENB signal; and the source of the NMOSFET 830 is coupled to the drain of an NMOSFET 832. The gate of the NMOSFET 832 receives the ENB signal; and the source of the NMOSFET 832 is coupled to the gate of the NMOSFET 813. The drain of an NMOSFET 834 of the gate OVT circuit 286-2 is coupled to the source of the NMOSFET 830 and the drain of the NMOSFET 832; the gate of the NMOSFET 834 is coupled to the pad 180; and the source of the NMOSFET 834 receives the VDDIO voltage. Due to this arrangement, the NMOSFET 813 is turned off with any level of the PAD voltage when the switch circuit 288 is disabled. In response to the PAD voltage exceeding the VDDIO voltage when the switch circuit 288 is enabled, the gate of the NMOSFET 813 is set to the minimum of the PAD voltage and VDDIO voltage.

As also depicted in FIG. 8A, the gate OVT circuit 286-2 may include another PMOSFET 836, which has its source-to-drain current path coupled between the source of the NMOSFET 832 and the gate of the NMOSFET 811. Moreover, as depicted in FIG. 8A, the drain of the PMOSFET 836 provides a signal (called the "EN_CHARGEPUMP signal" in FIG. 8A) for purposes for enabling a charge pump circuit.

In accordance with further example embodiments, if the PAD voltage does not go high enough to stress the NMOSFET 813, then the gate OVT circuit 286-2 may be omitted.

Figure 8B:
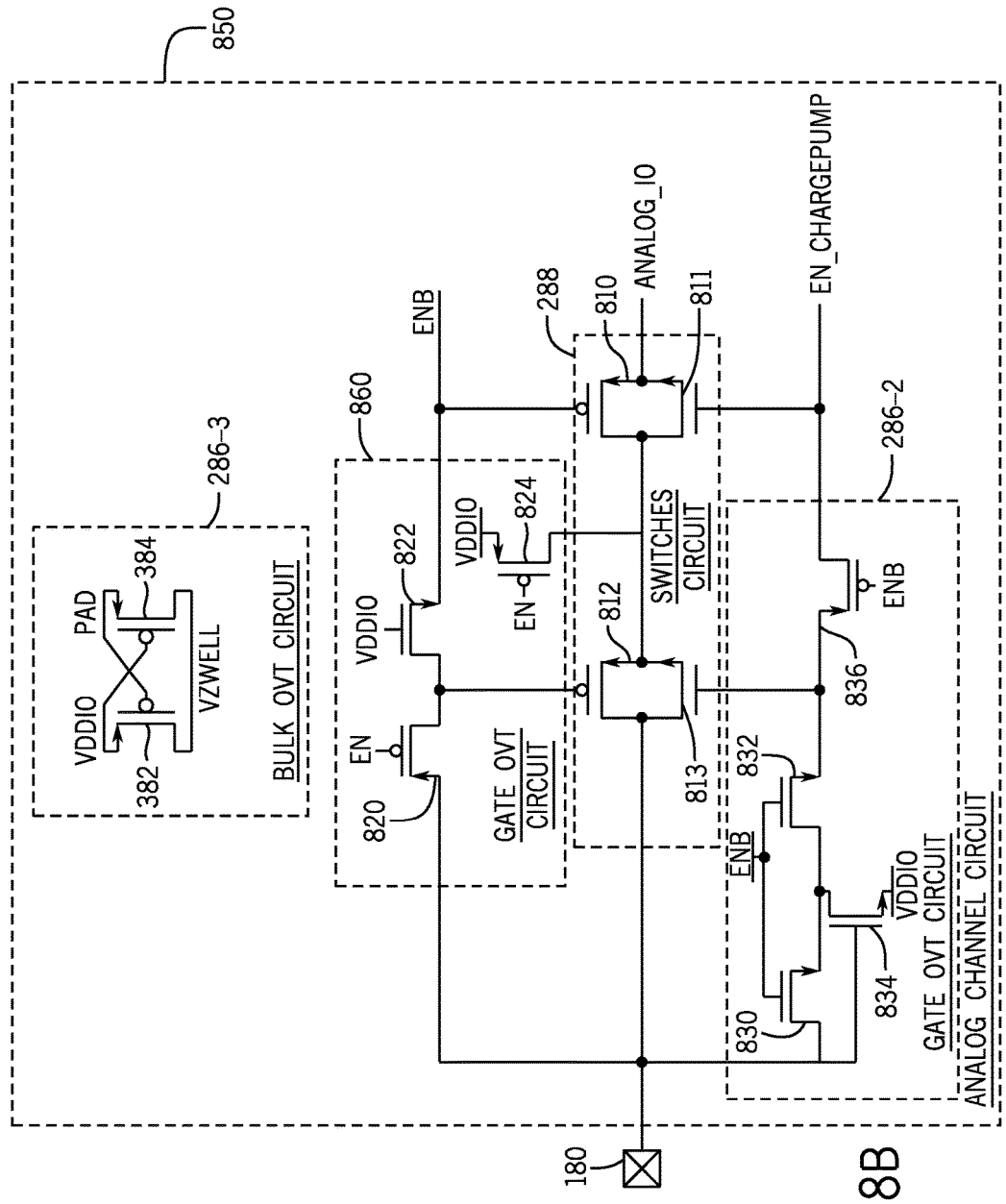
FIG. 8B is a schematic diagram of an analog channel circuit according to a further example embodiment.

FIG. 8B depicts an analog channel circuit 850 in accordance with further example embodiments. In general, the analog channel circuit 850 has a similar design to the analog channel circuit 280 of FIG. 8A, with like reference numerals being used to denote similar components. Unlike the analog channel circuit 280, the PMOSFET 820 of the circuit 850 receives the EN signal (asserted to enable the switch circuit 288).

While the present techniques have been described with respect to a number of embodiments, it will be appreciated that numerous modifications and variations may be applicable therefrom. It is intended that the appended claims cover all such modifications and variations as fall within the scope of the present techniques.

What is claimed is:
1. A method comprising:
using a first transistor of an input/output (I/O) circuit of an integrated circuit to couple an I/O pad of the integrated circuit to an output terminal of logic to communicate a signal provided by the logic to a driver circuit of the I/O circuit;

coupling a source terminal of an n-channel metal-oxide-semiconductor field effect transistor (NMOSFET) to a control terminal of the first transistor;

coupling a gate terminal of the NMOSFET to the supply voltage;

coupling a drain terminal of the NMOSFET to an enable signal;

controlling the enable signal to control whether the first transistor is activated or deactivated; and inhibiting a leakage current in the first transistor due to a voltage of the pad exceeding a supply voltage of the integrated circuit when the enable signal causes the first transistor to be deactivated, wherein inhibiting the leakage current comprises:

coupling a control terminal of a switch to the supply voltage;

activating the switch in response to the voltage of the pad exceeding the supply voltage to transition the switch from a first state of the switch in which the switch is deactivated to a second state in which the switch couples the control terminal of the first transistor to the voltage of the pad;

using a comparator to compare the voltage of the pad to the supply voltage; and coupling the output terminal of the comparator to a substrate associated with the first transistor.

2. The method of claim 1, wherein the comparator comprises cross-coupled transistors to regulate a voltage of the substrate in response to the difference between the voltage of the pad and the supply voltage.

3. The method of claim 1, wherein using the first transistor comprises coupling a first conductive channel of the first transistor in parallel with a second conductive channel of another transistor, and using the first conductive channel and the second conductive channel to communicate the signal provided by the logic to the driver circuit.

4. The method of claim 1, further comprising inhibiting a leakage current in another transistor of the I/O circuit due to the voltage of the pad exceeding the supply voltage, comprising:

coupling a control terminal of another switch to the supply voltage; and activating the another switch in response to the voltage of the pad exceeding the supply voltage to transition the another switch from a first state of the another switch in which the another switch is deactivated to a second state of the another switch in which the another switch couples the control terminal of the another transistor to the voltage of the pad.

5. An apparatus comprising:
an input/output (I/O) pad having a pad voltage; and
an input/output (I/O) circuit to receive a supply voltage, the I/O circuit comprising:
logic to provide a signal;
a driver circuit;
a first p-channel metal oxide field effect transistor (PMOSFET) comprising a gate, a channel and a terminal to control coupling of the signal provided by the logic to the driver circuit, wherein the first PMOSFET is associated with a substrate;
a first n-channel metal-oxide-semiconductor field effect transistor (NMOSFET) comprising a gate coupled to the supply voltage, a source coupled to the gate of the first PMOSFET, and a drain coupled to an enable signal to control activation and deactivation of the first PMOSFET; and a leakage prevention circuit comprising:
a switch coupled between the gate of the first PMOSFET and the I/O pad, wherein the switch comprises a control terminal coupled to the supply voltage and the switch is adapted to, when the enable signal is controlled to cause deactivation of the first PMOSFET, couple the gate of the first PMOSFET to the pad voltage in response to the pad voltage exceeding the supply voltage; and
a comparator to couple the higher of the supply voltage and the pad voltage to the substrate.

6. The apparatus of claim 5, wherein the comparator comprises:
a second PMOSFET comprising a source terminal to receive the pad voltage, a drain terminal, and a gate terminal to receive the supply voltage; and
a third PMOSFET comprising a source terminal to receive the supply voltage, a drain terminal connected to the drain terminal of the second PMOSFET, and a gate terminal to receive the pad voltage.

7. The apparatus of claim 6, wherein the second PMOSFET and the third PMOSFET comprise cross-coupled transistors.

8. The apparatus of claim 5, wherein the driver circuit comprises an output coupled to the pad, an input, and a second PMOSFET comprising a gate and a channel, wherein the second-PMOSFET is adapted to couple the I/O pad to the supply voltage based on the input of the driver circuit.

9. The apparatus of claim 8, wherein the leakage prevention circuit further comprises:
another switch coupled between the gate of the second PMOSFET and the pad, wherein another switch comprises a control terminal coupled to the supply voltage and the another switch is adapted to couple the gate of the second PMOSFET to the pad voltage in response to the pad voltage exceeding the supply voltage.

10. The apparatus of claim 5, further comprising:
a second n-channel metal-oxide-semiconductor field effect transistor (NMOSFET) coupled to the first PMOSFET to form a transmission gate to selectively communicate the signal provided by the logic to the driver circuit.

11. The apparatus of claim 10, wherein:
the second NMOSFET comprises a source terminal and a drain terminal;
the first PMOSFET comprises a source terminal and a drain terminal;
the source terminal of the first PMOSFET is coupled to the source terminal of the second NMOSFET; and
the drain terminal of the first PMOSFET is coupled to the drain terminal of the second NMOSFET.

12. The apparatus of claim 11, wherein the source terminals of the first PMOSFET and the second NMOSFET are coupled to the logic to receive the signal provided by the logic.

13. The apparatus of claim 5, wherein the switch further comprises a second PMOSFET comprising a source terminal coupled to the gate of the first PMOSFET and a drain terminal coupled to the I/O pad.

* * * * *